United States Patent [19]

Solomon et al.

[11] Patent Number: 4,458,162
[45] Date of Patent: Jul. 3, 1984

[54] TTL LOGIC GATE

[75] Inventors: Paul M. Solomon, Yorktown Heights, N.Y.; Siegfried K. Wiedmann, Stuttgart, Fed. Rep. Germany

[73] Assignee: International Business Machines Corporation, Armonk, N.Y.

[21] Appl. No.: 282,110

[22] Filed: Jul. 10, 1981

[51] Int. Cl.³ .............. H03K 19/088; H03K 19/013
[52] U.S. Cl. .................... 307/456; 307/254; 307/280; 307/299 A
[58] Field of Search .............. 307/456–458, 307/299 A, 280, 300, 270, 254

[56] References Cited

U.S. PATENT DOCUMENTS

| | | | |
|---|---|---|---|
| 3,303,355 | 6/1963 | Kolling | 307/457 |
| 3,564,281 | 2/1971 | Tokunaga et al. | 307/456 X |
| 3,571,616 | 3/1971 | Andrews | 307/456 |
| 3,629,609 | 12/1971 | Pedersen et al. | 307/456 |
| 3,769,530 | 10/1973 | Kalb et al. | 307/456 X |
| 3,867,644 | 2/1975 | Cline | 307/457 X |
| 3,934,157 | 1/1976 | Evans | 307/299 A X |
| 4,092,551 | 5/1978 | Howard et al. | 307/456 X |
| 4,194,131 | 3/1980 | Mrazek et al. | 307/299 A X |

Primary Examiner—Larry N. Anagnos
Assistant Examiner—David R. Bertelson
Attorney, Agent, or Firm—Thomas J. Kilgannon

[57] ABSTRACT

A Transistor-Transistor Logic (TTL) gate is disclosed wherein a different amount of base current is applied to the inverter transistor than is applied to the base of the output transistor. In one embodiment, a current mirror circuit controls the amount of base current flowing between the input transistor collector terminal and the base terminal of the inverter transistor to an amount less than that flowing between the input transistor collector terminal and the base terminal of the output transistor. In another embodiment, a resistor in series with the base of the inverter transistor performs the same function as the current mirror circuit.

4 Claims, 2 Drawing Figures

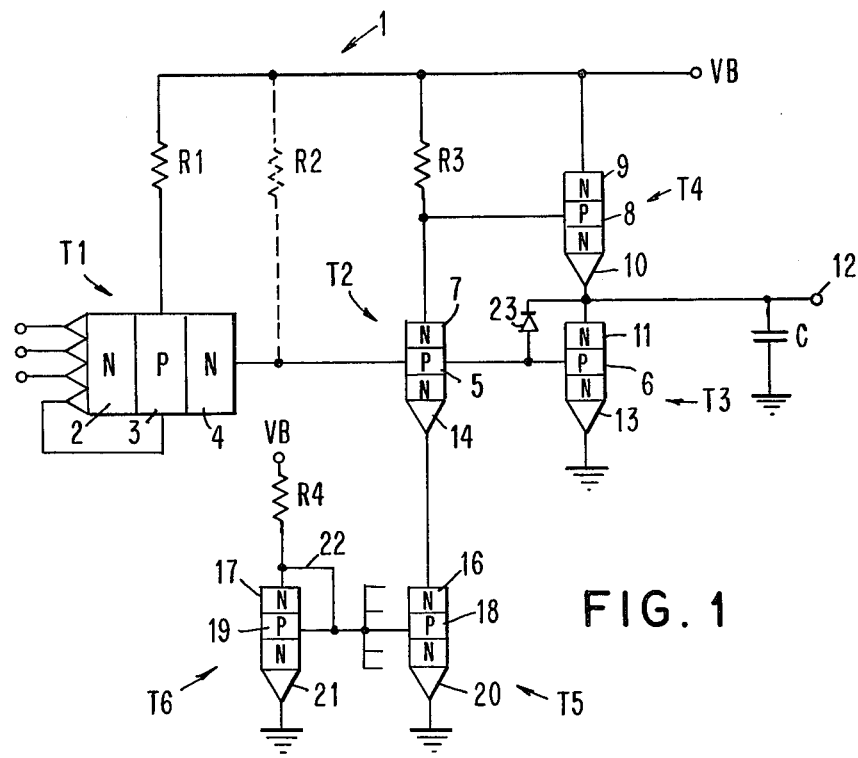
FIG. 1
FIG. 2
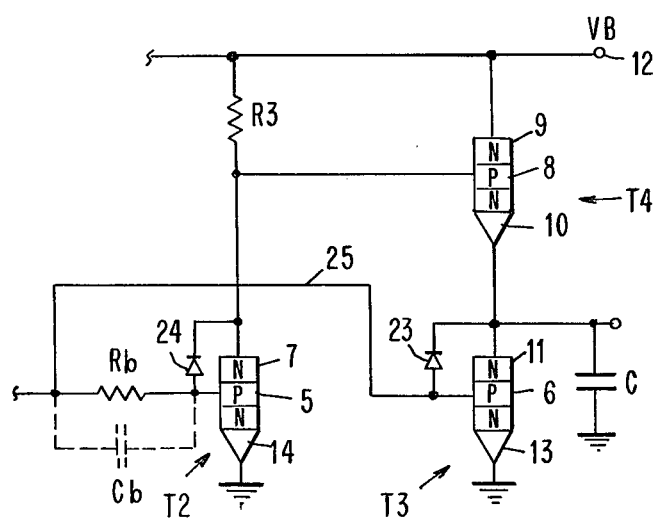

TTL LOGIC GATE

DESCRIPTION

1. Technical Field

This invention relates to bipolar transistor logic circuits and more particularly relates to transistor-transistor logic (TTL) logic circuit wherein the power supply voltage is reduced by one base emitter voltage drop. Still more particularly it relates to TTL logic gates wherein a different amount of base current is applied to the phase transistor of the circuit than is applied to the base of the output transistor. Still more specifically, means are connected to the inverter transistor for controlling the amount of base current flowing between the input transistor collector terminal and the base terminal of the inverter transistor to an amount less than that flowing between the input transistor collector terminal and the base terminal of the output transistor.

2. Background Art

In the integrated circuit environment, switching speed is often achieved at the expense of higher power dissipation or lower power dissipation is often attained at the expense of higher switching speeds. In other words, it is a world of trade-offs where an advantage in one area is achieved by giving up something in another area. To the extent that it is very difficult to address all the parameters involved to obtain the best possible approach, TTL circuits, like other transistors circuit families, have evolved gradually as the functions and details of these circuits have become better understood.

Just when the ultimate is believed to have been achieved, a new insight into the operation of such circuits provides a new advance which results in an enhancement of some factor such as speed, power dissipation or circuit density.

Exemplary circuits of the TTL genre may be found in the prior art U.S. Pat. No. 3,629,609 filed Feb. 20, 1970 and in U.S. Pat. No. 3,571,616 filed June 18, 1969. The latter patent discloses a circuit in which a pull-up transistor is used to reduce the resistance of the charging path of the output capacitance. This reduction in resistance is however achieved at the expense of some increased voltage levels.

U.S. Pat. No. 3,934,157 filed Sept. 23rd, 1974 overcomes the problem of the aforementioned increased voltage levels by providing for the parallel drive of an output transistor and an inverter transistor by an input transistor. The inverter transistor drives an active pull-up transistor which results in an improvement in switching speed. The connecting of the bases of the output and inverter transistors eliminated the need for higher input signals and higher power voltage levels.

From all the foregoing, it should be clear, particularly in the integrated circuit environment, that any advance which contributes to a reduction in dc power consumption and improves the power-delay product is very desirable. Even though the present trend is to increase the number of circuits per chip so that device size and capacitance are continually being decreased, little has been done to reduce wiring load in the same proportion. Accordingly, it becomes increasingly desirable to have logic gates of the type described herein which can supply large transient currents while, at the same time, minimizing dc power dissipation. While the prior art has recognized the need for reduced power dissipation and high speed switching, such enhancements have been achieved to only a limited degree.

It is, therefore, a principle object of this invention to provide a logic gate having very low dc power dissipation and an enhanced power-delay product.

It is another object of the present invention to provide a logic gate wherein saturation of the inverter transistor is avoided by operating a current mirror circuit connected to the inverter transistor in a dynamic mode.

It is another object of the present invention to limit the current flow in the inverter transistor without limiting the current sinking capabilities of the output transistor.

Still another object is to provide a logic gate wherein the current sinking capablity of the output transistor is enhanced by applying a higher base current to the output transistor than to the base of an inverter transistor.

BRIEF SUMMARY OF THE INVENTION

The present invention relates to Transistor-Transistor Logic (TTL) logic gates which are quasi-complementary in character and are adapted to drive large capacitive loads at high speeds with a minimum dc power dissipation. Similar to a conventional TTL logic gate, the present logic gate has a multi-emitter input transistor. This transistor is operated under conditions of controlled saturation shorting one of the emitter inputs to the base of the input transistor. The output of the input transistor is connected to the base of an inverter transistor, the inverted output of which is connected to a pull-up transistor while the in phase or noninverted output is connected directly to the base of the output transistor.

To prevent saturation of the inverter transistor, a current sink circuit in the form of a current mirror circuit is connected to the emitter of the inverter transistor. The collector-to-emitter voltage of a current sink transistor which forms part of the current mirror circuit has two values, one of which controls the amount of current flowing in the inverter transistor and the other of which is approximately zero. The output transistor preferably has an anti-saturation clamp to reduce charge storage.

When the input transistor is activated, the inverter and output transistors are rendered conductive and the current into the base of the output transistor is determined by the value of a resistor in series with the base of the input transistor. The maximum current that the output transistor can sink is the dc base current multiplied by the output transistor current gain. The pull-up transistor is simultaneously rendered nonconductive by the switching of the inverter transistor.

When one of the inputs is removed, both the inverter and output transistors are turned off very quickly because the low impedance input is directly coupled to the bases of these transistors. The pull-up transistor is turned on as soon as the inverter transistor is turned off. The output current which can be supplied by the now conducting pull-up transistor is the current gain multiplied by its dc base current which is supplied from the circuit voltage source via a resistor.

In an alternate scheme, Schottky clamps are connected between the bases and collectors of the inverter and output transistors. An additional resistor connected between the bases of the inverter and output transistors allows the latter to sink a much larger current than the former. A speed-up capacitor may be added in parallel with the resistor.

These and other objects, features and advantages will be more apparent from the following more particular description of the preferred embodiments.

BRIEF DESCRIPTION OF THE DRAWINGS

FIG. 1 is a schematic diagram of a Transistor-Transistor Logic (TTL) gate which utilizes a current mirror circuit to prevent saturation of the inverter transistor without simultaneously limiting the ability of the output transistor to sink high currents.

FIG. 2 is a schematic diagram of a TTL logic gate wherein the collector current output of a multi-emitter input transistor is applied in parallel to the bases of inverter and output transistors and wherein a resistor connected in series with the base of the inverter transistor reduces the value of base current applied to inverter transistor as opposed to that applied to the base of the output transistor.

DESCRIPTION OF PREFERRED EMBODIMENTS

Referring now to FIG. 1, there is shown a schematic diagram of TRANSISTOR-TRANSISTOR LOGIC (TTL) gate 1 which utilizes a current mirror circuit to prevent saturation of the inverter transistor thereof without simultaneously limiting the ability of its output transistor to sink high currents. In FIG. 1, logic gate 1 includes a plurality of transistors T1–T6 all of which are NPN bipolar transistors. All of these transistors are fabricated using techniques well known to those skilled in the semiconductor fabrication arts. In the integrated circuit environment, a plurality of such devices would be interconnected in a desired way to provide a given logic function in a well known manner. Since the fabrication process forms no part of the present invention, let it suffice to say that the fabrication techniques are within the purview of those skilled in the fabrication of semiconductor integrated circuits.

In FIG. 1, logic gate 1 includes a multi-emitter input transistor T1 which is operated under conditions of controlled saturation by shorting one of the emitter inputs 2 to the base 3 of transistor T1. The collector 4 of transistor T1 is connected to the base 5 of inverter transistor T2 and base 6 of output transistor T3. Collector 7 of transistor T2 is connected to the base 8 of pull-up transistor T4. A power supply, VB, is connected directly to collector 9 of transistor T4 and to base 8 of transistor T4 and collector 7 of transistor T2 via a resistor R3 and to base 3 transistor T1 via a resistor R1. Emitter 10 of transistor T4 is connected to collector 11 of transistor T3, both of which are connected to an output terminal 12. Emitter 13 of transistor T3 is grounded. Emitter 14 of inverter transistor T2 instead of being grounded as has usually been done by the prior art, is connected to a current mirror circuit 15, which is comprised of NPN transistors T5, T6. Thus, emitter 14 of transistor T2, is connected to the collector 16 of transistor T5. Transistor T6 which may be identical to transistor T5 has its collector 17 connected via a resistor R4 to voltage source VB. Bases 18, 19 of transistors T5, T6, respectively, are connected together and the emitters 20, 21 of transistors T5, T6 respectively, are both grounded. In FIG. 1, collector 17 of transistor T6 is shorted to base 19 thereof by interconnection 22.

Output capacitor C is shown in FIG. 1 connected between output terminal 12 and ground. Output transistor T3 has an anti-saturation clamping diode 23 connected between its base 6 and collector 11. Finally, an optional resistor R2 shown connected in parallel with resistor R1 may be utilized to increase the amount of current supplied to the base of output transistor T3.

The above described circuit achieves a reduction in power consumption and high speed switching of output transistor T3 by simultaneously controlling the current in inverter transistor T2 such that transistor T2 is kept out of saturation and by providing a much higher current to base 6 of output transistor T3 causing it to switch at high speed.

Normally, it is desirable to have transistor characteristics practically identical. To the extent that this has been achieved by the prior art, the base currents to the inverter and output transistors are the same resulting in a relatively low switching speed of the output transistor.

By recognizing that a higher base current to output transistor T3, of FIG. 1 permits very much higher currents in that device, an extremely fast discharge of output capacitance C through transistor T3 is achieved when output transistor T3 switches. How this higher base current is supplied to output transistor T3 will become apparent from the following discussion of the operation of logic gate 1.

When each of the inputs to input transistor T1 is energized, current flows into the bases of transistors T2, T3. The current into base 6 of the output transistor is determined by the value of resistor R1 in series with base 3 of input transistor T1. To the extent that higher base current is required, resistor R2 in parallel with R1 can provide additional current to base 6 of output transistor T3. Since base 5 of inverter transistor T2 is connected in parallel with base 6 of output transistor T3, the available base current would normally be shared by transistors T2, T3. The presence of base current at base 5 of inverter transistor T2 and at base 6 of transistor T3 causes both of these devices to switch. Prior to the switching of transistors T2, T3, pull-up transistor T4 is in a conductive state and output capacitance C is charged to the voltage VB via conducting transistor T4. When devices T2, T3 are rendered conductive by the appearance of current on their bases, transistor T4 is rendered nonconductive and output capacitance C discharges through the now conducting output transistor T3. The maximum current that output transistor T3 can sink is its DC base current multiplied by the current gain of output transistor T3. However, to the extent that the characteristics of transistors T2, T3 are substantially identical, they will share the available base current and the switching of transistor T3 will be relatively slow compared to what it could be if a higher base current were available to it. In FIG. 1, a higher current is made available at base 6 of output transistor T3 than at base 5 of inverter transistor T2 by keeping inverter transistor T2 out of heavy saturation. When transistor T2 is out of heavy saturation, only a small amount of available base current is required to switch it leaving the remainder available to switch output transistor T3. The latter now has the ability to carry a higher current as a result of the higher value of driving base current. Transistor T2 is kept out of heavy saturation by adjusting the value of resistor R3 so that transistor T2 is brought as close to saturation as possible without getting into heavy saturation. By making resistor R3 as high a value as permitted so that heavy saturation of transistor T2 is prevented, current flow in resistor R3 is significantly reduced and total power consumption in the circuit is also reduced.

To the extent that transistor T2 is kept out of saturation making more base current available for output transistor T3, transistor T2 can carry a certain current and requires a certain base current which is a function of the base-emitter voltage drop of transistor T2. Without any external limitation, a rather high current could flow through transistor T2 requiring a rather high base current which, in turn, would not be available as driving base current for output transistor T3. The current flow through transistor T2 is controlled by the use of current mirror circuit 15 operating in a known way. Thus, when transistor T2 is conducting, the amount of current flowing in it is controlled by the amount of current flowing in resistor R4 which, in turn, controls the current which flows in transistor T5.

When transistor T2 is in a nonconducting state, the characteristic of current mirror circuit 15 is such that the current in transistor T5 drops practically to zero with a small change in its base-collector voltage. When transistor T5 becomes nonconducting, the current flowing in resistor R4 passes to ground via the base-emitter diodes of transistors T5, T6.

Under the conditions just described, the base current requirements of transistor T2 are severely limited and a greater amount of available base current is applied to base 6 of output transistor T3 than in prior art circuits which do not limit the current flowing in transistor T2 while, at the same time, keeping that device out of heavy saturation. A simple Schottky clamp between base 5 and collector 7 of transistor T2 cannot be used without severely limiting the current sinking capabilities of output transistor T3. In this regard, antisaturation clamping diode 23 prevents transistor T3 from going into saturation, a condition which would effectively reduce the base current on that device.

Referring now to FIG. 2, there is shown a schematic diagram of that portion of FIG. 1 which includes transistors T2, T3 and T4. Input transistor T1, if it were shown in FIG. 2, would be connected to base 5 of transistor T2 in the same manner as shown in FIG. 1. In addition, resistor R1, if it were shown, would be connected in the same manner to base 3 of transistor T1 and voltage source VB as it is shown in FIG. 1. Resistor R2 would be similarly connected in FIG. 2 as shown in FIG. 1.

In FIG. 2, current mirror circuit 15 has been eliminated and emitter 14 of transistor T2 is connected directly to ground. An antisaturation clamping diode 24 is shown in FIG. 2, connected between base 5 and collector 7 of transistor T2. In addition, a resistor Rb is shown connected in series with base 5 of transistor T2. Also, a direct connection 25 is shown which is connected to collector 4 of input transistor T1 and base 6 of output transistor T3. Finally, a speed-up capacitor Cb is shown connected in parallel with resistor Rb. Apart from the above described changes, circuit of FIG. 2 is identical with the circuit of FIG. 1.

The operation of the circuit of FIG. 2 is similar to that described hereinabove in connection with FIG. 1. In the circuit of FIG. 2, antisaturation clamp diode 24 prevents transistor T2 from going into heavy saturation in the usual manner. Apart from this, when base current to transistor T2 is supplied from input transistor T1, the amount of base current applied to base 5 of transistor T2 is directly limited by resistor Rb providing a higher proportional share of the available base current to the base of output transistor T3. To the extent that the driving base current at base 6 of output transistor T3 is higher than could be expected without the presence of resistor Rb, output transistor T3 can sink a higher current and, output capacitance C discharges through it at high speed. To the extent that the current flow in transistor T2, is a function of its base current, the current in transistor T2 is limited. Also, because the transistor T2 is kept out of saturation a result similar to that achieved by the circuit of FIG. 1 is achieved by the circuit of FIG. 2.

The following Table I shows typical values for the various components shown in FIGS. 1, 2.

TABLE I

|  |  |
|---|---|
|  | $V_B = 2$ V |
|  | $R_1 = 8$K Ohm |
|  | $R_2 = 4$K Ohm |
|  | $R_3 = 4$K Ohm |
|  | $R_4 = 3.3$K Ohm |
|  | $R_B = 0.5$K Ohm |
|  | $C = 10$ pF |
| NPN-transistors: | common emitter current gain: |
|  | $\beta_N = 50$ (normal) $\beta_1 = 3$ (inverse) |
|  | base emitter voltage at 100 µA: 800 mV |
|  | Cut-off frequency: $f_T = 1$ GHz |
| Diode 23: | forward voltage at 100 µA: 600 mV |

Having thus described our invention, what we claim as new, and desire to secure by Letters Patent is:

1. A logic gate comprising:
an input transistor having a base terminal, a collector terminal and at least one emitter terminal connected to an input node, said base terminal being connected to a source of potential, an output transistor having an emitter terminal connected to ground, a collector terminal connected to an output node and a base terminal connected to said collector terminal of said input transistor, an inverter transistor having an emitter terminal, a base terminal connected to said collector terminal of said input transistor and a collector terminal connected to said source of potential, a pull-up transistor having an emitter terminal connected to said output node, a base terminal connected to the collector terminal of said inverter transistor and a collector terminal connected to said source of potential, and,
a current mirror circuit electrically connected to said emitter terminal of said inverter transistor for controlling the amount of base current flowing between said input transistor collector terminal and said base terminal of said inverter transistor to an amount less than that flowing between said input transistor collector terminal and said base terminal of said output transistor.

2. A logic gate according to claim 1 wherein said input transistor includes a plurality of emitters each connected to its own input node.

3. A logic gate according to claim 1 further including:
a first resistor connected between the base of said input transistor and said source of potential,
a second resistor connected between said source of potential and said collector of said inverter transistor and said base of said pull-up transistor, and,
a diode connected between the base and collector of said output transistor.

4. A logic circuit according to claim 1 wherein said current mirror circuit includes a first transistor, the collector of which is connected to said emitter of said inverter transistor, the emitter of which is connected to ground and the base of which is connected to the base of a second transistor, the emitter and collector of said second transistor being connected to ground and to a source of DC voltage, respectively, and, an interconnection connecting said collector and said base of said second transistor together.

* * * * *